(12) United States Patent
Auch et al.

(10) Patent No.: US 7,166,007 B2
(45) Date of Patent: Jan. 23, 2007

(54) ENCAPSULATION OF ELECTRONIC DEVICES

(75) Inventors: Mark Auch, Singapore (SG); Ewald Guenther, Singapore (SG); Lim Shuang Fang, Singapore (SG); Chua Soo Jin, Singapore (SG)

(73) Assignees: Osram Opto Semiconductors GmbH, Regensburg (DE); Institute of Materials Research and Engineering, Singapore (SG)

( * ) Notice: Subject to any disclaimer, the term of this patent is extended or adjusted under 35 U.S.C. 154(b) by 156 days.

(21) Appl. No.: 10/981,980

(22) Filed: Nov. 4, 2004

(65) Prior Publication Data

US 2005/0064780 A1 Mar. 24, 2005

Related U.S. Application Data

(60) Division of application No. 09/989,362, filed on Nov. 20, 2001, which is a continuation-in-part of application No. PCT/SG99/00143, filed on Dec. 17, 1999.

(51) Int. Cl.
*H01J 9/00* (2006.01)

(52) U.S. Cl. ............................. 445/23; 445/25

(58) Field of Classification Search .............. 445/23–25
See application file for complete search history.

(56) References Cited

U.S. PATENT DOCUMENTS

| | | | |
|---|---|---|---|
| 4,640,584 A | 2/1987 | Tsubakimoto et al. |
| 4,961,962 A | 10/1990 | Morimoto |
| 5,188,280 A | 2/1993 | Nakao et al. |
| 5,385,499 A | 1/1995 | Ogawa et al. |
| 5,550,408 A | 8/1996 | Kunitomo et al. |
| 5,552,913 A | 9/1996 | Shimizu et al. |
| 5,580,619 A | 12/1996 | Sakai et al. |
| 5,632,663 A | 5/1997 | Ishihara et al. |
| 5,714,838 A | 2/1998 | Haight et al. |
| 5,724,230 A | 3/1998 | Poetzinger |
| 5,750,258 A | 5/1998 | Sakai et al. |
| 5,777,386 A | 7/1998 | Higashi et al. |
| 5,804,917 A | 9/1998 | Takahashi et al. |
| 5,821,692 A | 10/1998 | Rogers et al. |
| 5,844,315 A | 12/1998 | Melton et al. |
| 5,900,675 A | 5/1999 | Appelt et al. |
| 5,939,783 A | 8/1999 | Laine et al. |
| 5,965,907 A | 10/1999 | Huang et al. |

(Continued)

FOREIGN PATENT DOCUMENTS

DE 3716856 12/1988

(Continued)

OTHER PUBLICATIONS

Bahadur, B., Liquid Crystals: Application and Usess, vol. 1, ISBN 9810201109.

(Continued)

*Primary Examiner*—Joseph Williams
(74) *Attorney, Agent, or Firm*—Fish & Richardson P.C.

(57) ABSTRACT

A method of encapsulating a device is disclosed. Spacer particles are randomly located in the device region to prevent a cap mounted on the substrate from contacting the active components, thereby protecting them from damage. The spacer particles are fixed to one side of the substrate to prevent any movement.

22 Claims, 6 Drawing Sheets

U.S. PATENT DOCUMENTS

| | | |
|---|---|---|
| 6,111,355 A | 8/2000 | Inoue et al. |
| 6,111,356 A | 8/2000 | Roitman et al. |
| 6,124,918 A | 9/2000 | Park et al. |
| 6,172,879 B1 | 1/2001 | Cilia et al. |
| 6,177,729 B1 | 1/2001 | Benenati et al. |
| 6,232,667 B1 | 5/2001 | Hultmark et al. |
| 6,259,204 B1 | 7/2001 | Ebisawa et al. |
| 6,260,264 B1 | 7/2001 | Chen et al. |
| 6,313,528 B1 | 11/2001 | Solberg |
| 6,339,254 B1 | 1/2002 | Venkateshwaran et al. |
| 6,364,196 B1 | 4/2002 | Wood et al. |
| 6,376,917 B1 | 4/2002 | Takeshita et al. |
| 6,569,706 B1 | 5/2003 | Pakbaz et al. |
| 6,633,124 B1 | 10/2003 | Himeshima et al. |
| 6,649,221 B1 | 11/2003 | Tateno et al. |
| 6,952,078 B1 * | 10/2005 | Guenther ............ 313/506 |
| 2002/0125484 A1 | 9/2002 | Silvernail et al. |
| 2003/0062518 A1 | 4/2003 | Auch et al. |
| 2003/0094691 A1 | 5/2003 | Auch et al. |

FOREIGN PATENT DOCUMENTS

| | | |
|---|---|---|
| EP | 0 884 792 | 12/1998 |
| EP | 0 910 228 | 4/1999 |
| EP | 0986112 | 3/2000 |
| EP | 1021070 | 7/2000 |
| JP | 58160927 | 9/1983 |
| JP | 3-171643 | 7/1991 |
| JP | 04090512 | 3/1992 |
| JP | 04136916 | 5/1992 |
| JP | 09097679 | 4/1997 |
| JP | 11176571 | 7/1999 |
| WO | WO 98/28767 | 7/1998 |
| WO | WO 98/28947 | 7/1998 |
| WO | WO 98/59528 | 12/1998 |
| WO | WO 00/16361 | 3/2000 |
| WO | WO 00/16362 | 3/2000 |
| WO | WO 01/04938 | 1/2001 |
| WO | WO 01/04963 | 1/2001 |
| WO | WO 01/39174 | 5/2001 |
| WO | WO 01/44865 | 6/2001 |
| WO | WO 01/45140 | 6/2001 |
| WO | WO 02/21557 | 3/2002 |
| WO | WO 03/030272 | 4/2003 |

OTHER PUBLICATIONS

Burroughs et al., "Light-emitting diodes based on conjugated polymers", 1990, Nature, London, vol. 347, 539-541.

* cited by examiner

ENCAPSULATION OF ELECTRONIC DEVICES

CROSS-REFERENCE TO RELATED APPLICATIONS

This application is a divisional and claims the benefit of priority under 35 U.S.C. Section 120 to U.S. application Ser. No. 09/989,362, filed on Nov. 20, 2001, which is a continuation-in-part of International Application Serial No. PCT/SG99/00143, filed Dec. 17, 1999. The disclosures of the prior applications are considered part of and are incorporated by reference in the disclosure of this application.

FIELD OF THE INVENTION

The present invention relates to organic LED (OLED) devices. More particularly, the invention relates to packaging of OLED devices.

BACKGROUND OF THE INVENTION

Figure 1:
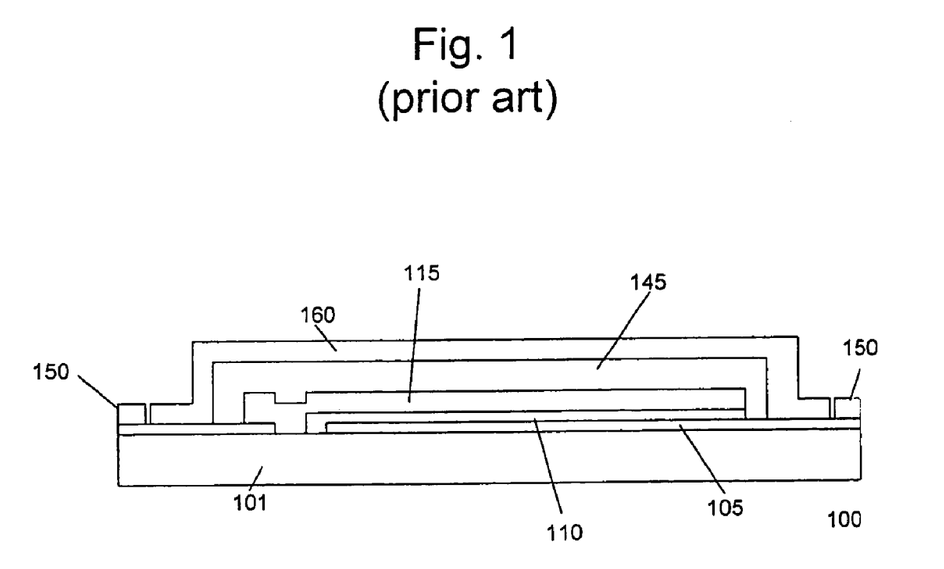
FIG. 1 shows an OLED device.

FIG. 1 shows an OLED device 100. The OLED device comprises one or more organic functional layers 110 between first and second electrodes 105 and 115. The electrodes can be patterned to form, for example, a plurality of OLED cells to create a pixilated OLED device. Bond pads 150, which are coupled to the first and second electrodes, are provided to enable electrical connections to the OLED cells.

To protect the OLED cells from the environment such as moisture and/or air, a cap 160 encapsulates the device. The active and electrode materials of the OLED cells are sensitive and can be easily damaged due to mechanical contact with, for example, the cap. To prevent damage to the OLED cells, a cavity cap or package is used. The cavity package provides a cavity 145 between the cap and OLED cells. The cavity also allows for the placement of desiccant materials to cope with finite leakage rate of the device.

Typically, the lateral dimensions of OLED devices are usually in the range of a few centimeters or more, depending on the applications. To accommodate the large lateral dimensions, thicker caps are used to provide the necessary mechanical stability to maintain the integrity of the cavity.

However, the demand for thin and flexible devices requires the use of thinner components, such as the cap and the substrate. Decreasing the thickness of the cap reduces its mechanical stability, making it more prone to bending which can cause the cavity to collapse, thereby damaging the OLED cells.

As evidenced from the above discussion, it is desirable to provide an OLED device having improved packaging, particularly those formed on thin or flexible substrates.

SUMMARY OF THE INVENTION

The invention relates to encapsulation for devices such as OLED devices. One or more OLED cells are provided in the device region of the substrate. A cap is mounted on the substrate to encapsulate the device. The cap forms a cavity in the device region, separating it from the OLED cells.

In accordance with the invention, spacer particles are provided in the device region to prevent the cap from contacting the OLED cells. In one embodiment, the spacer particles are randomly deposited on the substrate by spraying techniques. In one embodiment, the spacer particles are deposited by a dry spray technique. Alternatively, a wet spray technique is employed to deposit the spacer particles on the substrate. In one embodiment, the spacer particles are coated with an adhesive that can be cured after deposition of the spacer particles. Spacer particles in the non-device region are removed, leaving the spacer particles randomly distributed in the device region. A cap is mounted on the substrate to encapsulate the device. The spacer particles in the device region prevent the cap from contacting the OLED cells.

PREFERRED EMBODIMENTS OF THE INVENTION

The invention relates generally to OLED devices. In particular, the invention provides a cost-effective package for encapsulating OLED devices, particularly those formed on flexible or thin substrates. In accordance with one embodiment of the invention, spacer particles are provided between the OLED cells and the cap. The spacer particles prevent the cap from contacting the OLED cells.

Figure 2:
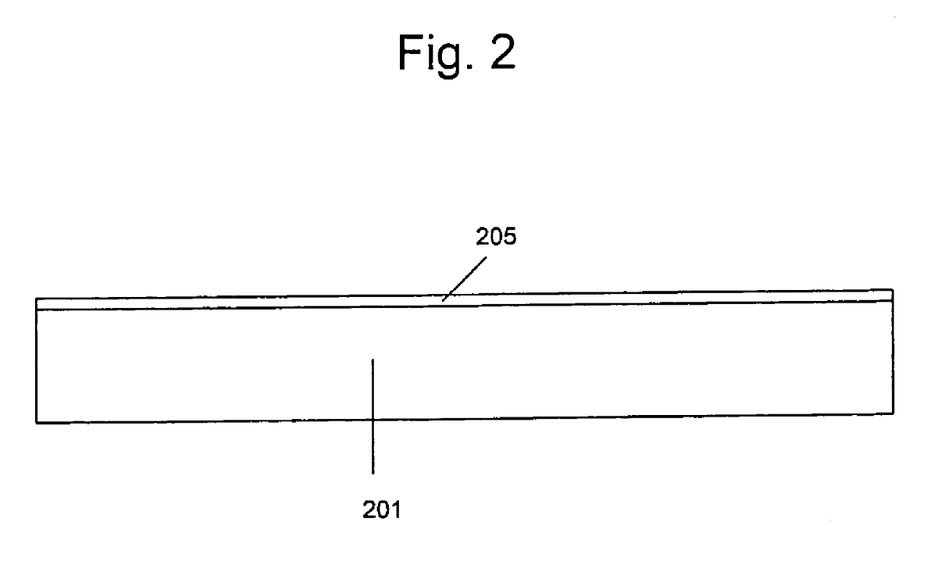
FIGS. 2–6 show a process for forming an OLED device in accordance with one embodiment of the invention.

FIGS. 2–6 show a process for fabricating an OLED device in accordance with one embodiment of the invention. Referring to FIG. 2, a substrate 201 is provided on which OLED cell or cells are formed. The substrate can comprise various types of materials, such as glass or polymer. Other materials which can adequately support the OLED cells are also useful.

In one embodiment, the substrate comprises a flexible material, such as a plastic film for forming a flexible device. Various commercially available plastic films can be used to serve as the substrate. Such films, for example, include transparent poly (ethylene terephthalate) (PET), poly (butylene terephthalate) (PBT), poly (enthylene naphthalate) (PEN), polycarbonate (PC), polyamides (PI), polysulfones (PSO), and poly (p-phenylene ether sulfone) (PES). Other materials such as polyethylene (PE), polypropylene (PP), poly (vinyl chloride) (PVC), polystyrene (PS) and poly (methyl methyleacrylate) (PMMA), can also be used to form the substrate. A flexible substrate comprising thin glass or other flexible materials is also useful.

In one embodiment, the substrate is about 20–300 µm thick. In some cases, the thin substrate may be mechanically unstable, creating processing problems. A temporary support layer (not shown) can be employed to stabilize the substrate during the fabrication process. The temporary support layer, for example, can be provided on the backside of the substrate. In one embodiment, the temporary support layer comprises a polymer foil coated with an adhesive for attaching to the substrate. After processing, the temporary layer is removed since the device package can be used to mechanically stabilize the device.

A conductive layer 205 is deposited on the substrate. The substrate can be provided with a barrier layer, such as silicon dioxide ($SiO_2$), beneath the conductive layer on the substrate surface prior to depositing the conductive. Barrier layers are particularly useful for substrates comprising soda lime glass. The barrier layer, for example, is about 20 nm thick. In one embodiment, the conductive layer comprises a transparent conductive material, such as indium-tin-oxide (ITO). Other types of transparent conductive layers, including zinc-oxide and indium-zincoxide, are also useful. Various techniques, such as chemical vapor deposition (CVD) physical vapor deposition (PVD), and plasma enhanced CVD (PECVD), can be employed to form the device layer. The conductive layer should be thin to reduce optical absorption and negative impact on subsequent film formation while satisfying electrical requirements. The conductive layer is typically about 0.02–1 μm thick.

Figure 3:
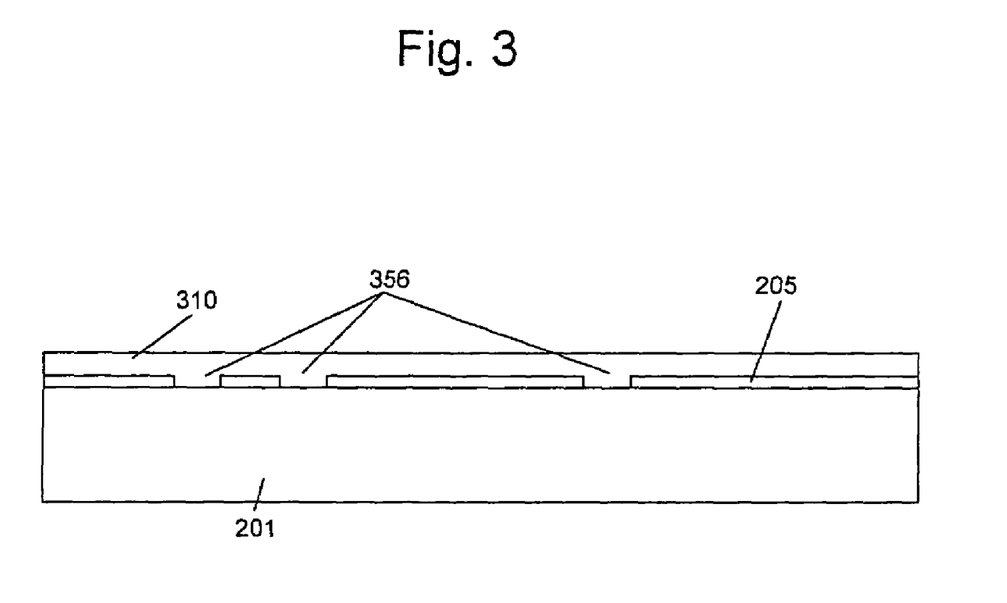

Referring to FIG. 3, the conductive layer 205 is patterned as desired to selectively remove portions of the layer, exposing portions 356 of the substrate. The patterned conductive layer serves as first electrodes for the OLED cells. In one embodiment, the conductive layer is patterned to form strips that serve as, for example, anodes of a pixelated OLED device. The patterning process can also form connections for bond pads. Conventional techniques, such as photolithography and etching, can be used to pattern the conductive layer. Patterning techniques using a stamp are also useful. Such techniques are described in co-pending international patent application titled "Mechanical Patterning of a Device Layer", PCT Application No. PCT/SG99/00074, which is herein incorporated by reference for all purposes. One or more organic functional layers 310 are formed on the substrate, covering the exposed substrate portions and conductive layer. The functional organic layers comprise, for example, conjugated polymer or low molecular materials such as $Alq_3$. Other types of functional organic layers are also useful. The organic functional layers can be formed by conventional techniques, for example, wet processes such as spin coating or vacuum sublimation (for $Alq_3$ organic layers). The thickness of the organic layers is typically about 2–200 nm.

Figure 4:
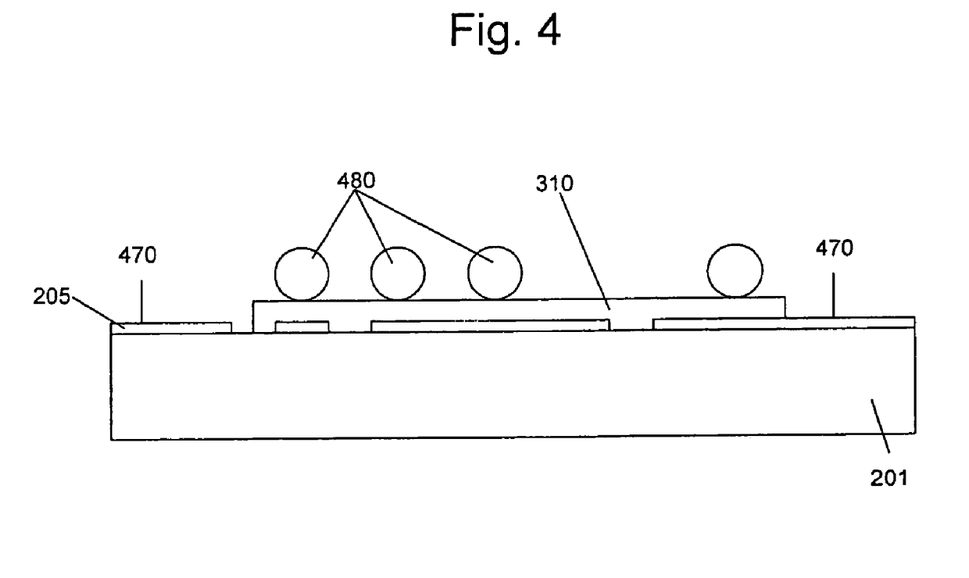

Referring to FIG. 4, portions of the organic layers can be selectively removed to expose underlying layers in regions 470 for bond pad connections. Selective removal of the organic layers can be achieved using, for example, a polishing process. Other techniques, such as etching, scratching, or laser ablation, are also useful.

In accordance with one embodiment of the invention, spacer particles 480 are deposited on the substrate. In one embodiment, the spacer particles comprise a spherical shape. Spacer particles having other geometric shapes, such as cubical, prism, pyramidal, or other regular or irregular shapes are also useful. The average mean diameter of the spacer particles is sufficient to maintain the desired height of the cavity, which for example is about 2–50 μm. The size and shape distribution of the spacer particles should be sufficiently narrow to ensure proper separation between the cap and OLED cells.

The spacer particles are preferably fixed to one side of the substrate to avoid any movement. In one embodiment, the spacer particles are coated with a thin layer of adhesive before deposition. The adhesive layer comprises, for example, epoxy resin or acrylic resin. In one embodiment, the adhesive is cured by heat treatment. In another embodiment, the adhesive is cured by exposure to ultraviolet radiation. In yet another embodiment, the adhesive comprises a hot melt material.

In one embodiment, the spacer particles are randomly distributed on the substrate. The spacer particles occupy both active and non-active parts (i.e., emitting and non-emitting areas) of the device. In another embodiment, the spacer particles are confined to the non-active areas. Various techniques such as photolithography technology can be employed to pattern the coverage of the spacer particles. Alternatively, shadow mask or stencil mask technology can be used. A shadow mask with the required pattern is placed in close proximity or direct contact with the surface before deposition of the spacer particles. During the spray application process, only the regions which are exposed by the mask will be covered with spacer particles. Alternatively, a patterned dry resist film can be laminated on the bare surface. After the spacer particles are deposited, the dry resist film is cured and removed from the surface, leaving the exposed areas covered with spacer particles. A liquid resist material can also be used in a similar manner.

The distribution or density of the spacer particles should be sufficient to prevent the cap from contacting the OLED cells in the presence of mechanical stress, whether by designed (flexible devices) or accident (handling of the devices). The distribution can be varied to accommodate design requirements, such as the thickness of the cap, thickness of the substrate, and amount of device flexibility needed.

In a preferred embodiment, the spacer distribution is sufficient to maintain the height of the cavity without visibly effecting the emission uniformity of the OLED cells. Typically, a spacer distribution having an average distance between spacer particles of about 10–500 μm is adequate in preventing the cap from contacting the OLED cells. In one embodiment, the density of the spacer particle distribution is about 10–1000 $No/mm^2$. Such a distribution along with the small size of the spacer particles ensures that their influence on emission uniformity is essentially invisible to the unaided human eye.

To avoid causing shorts between the electrodes, the spacer particles preferably comprise a non-conductive material. In one embodiment, the spacer particles are made of glass. Spacer particles made of other types of non-conductive materials, such as silica, polymers, or ceramic, are also useful.

In one embodiment, the spacer particles are deposited by spraying techniques. In a preferred embodiment, a dry spray technique is employed to deposit the spacer particles. Dry spray techniques are described in, for example, Birenda Bahadur (Ed), Liquid Crystals: Applications and Uses, Vol. 1 (ISBN 9810201109), which is incorporated by reference for all purposes.

Dry spray techniques typically comprise electrostatically charging the spacer particles with a first polarity (positive or negative) and the substrate with a second polarity (negative or positive). The spacer particles are blown against the substrate with dry air supplied by a dry air sprayer. Dry air sprayers, such as a DISPA-μR from Nisshin Engineering Co., can be used. Electrostatic attraction causes the spacer particles to adhere to the substrate while electrostatic repulsion between the particles prevents particle agglomeration on the substrate. A particle density of 160–180 $No/mm^2$ can be achieved using a dry air sprayer which generates dry air, for example, having a dew point $\leq -58°$ C. at pressure of 2 $kg/cm^2$ and a current of 50 l/min for 10 s spray duration. By varying the spraying parameters, other particle densities can be achieved.

The use of a wet spray technique to deposit the spacer particles on the substrate is also useful. Wet spray techniques are described in, for example, Birenda Bahadur (Ed), Liquid Crystals: Applications and Uses, Vol. 1 (ISBN 9810201109), which is already incorporated by reference for all purposes. Typically, the spacer particles are suspended in an alcoholic or aqueous liquids, such as ethanol, isopropanol, or a mixture comprising alcohol and water. The spacer concentration, for example, is about 0.1–0.5% by weight. Ultrasonic waves can be used to disperse the particles to prevent agglomeration. For example, the spacer particles can be irradiated with ultrasonic waves for several minutes prior to particle deposition. The prepared suspension is sprayed with air through a nozzle onto the substrate, depositing the spacer particles thereon.

Figure 5:
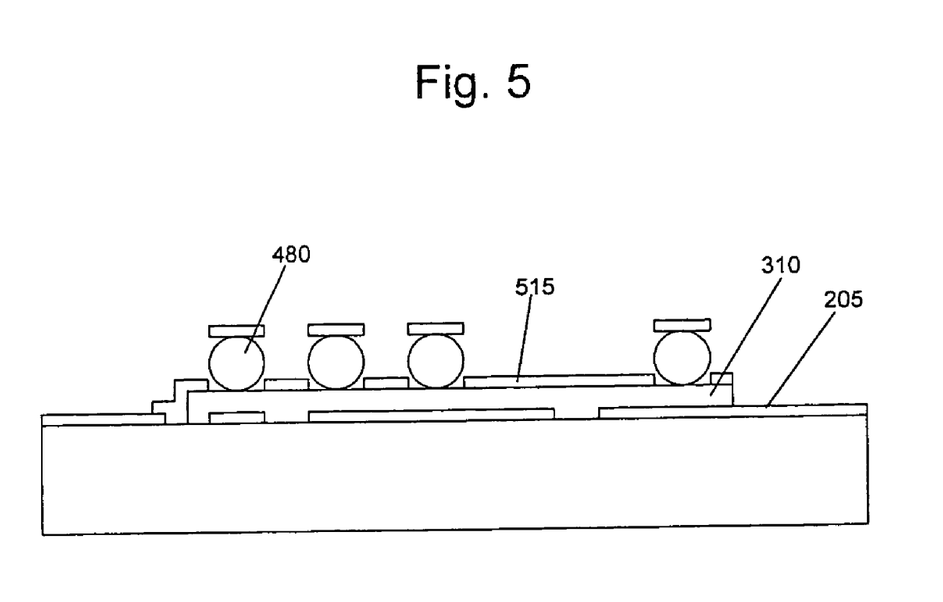

Referring to FIG. 5, a second conductive layer 515 is deposited on the substrate, covering the spacer particles and other layers formed thereon. The conductive layer comprises, for example, a metallic material such as Ca, Mg, Ba, Ag or a mixture or alloy thereof. Other conductive materials, particularly those which comprises a low work function, can also be used to form the second conductive layer. In one embodiment, the second conductive layer is patterned to form electrode strips that serve as cathode for a pixelated OLED device. Also, connections for bond pads can be formed during the patterning process. Alternatively, the conductive layer can be selectively deposited to form cathode strips and bond pad connections. Selective deposition of the conductive layer can be achieved with, for example, mask layers. The cathode strips are typically orthogonal to the anode strips. Forming cathode strips that are diagonal to the anode strips is also useful. The intersections of the top and bottom electrode strips form organic LED pixels.

Figure 6:
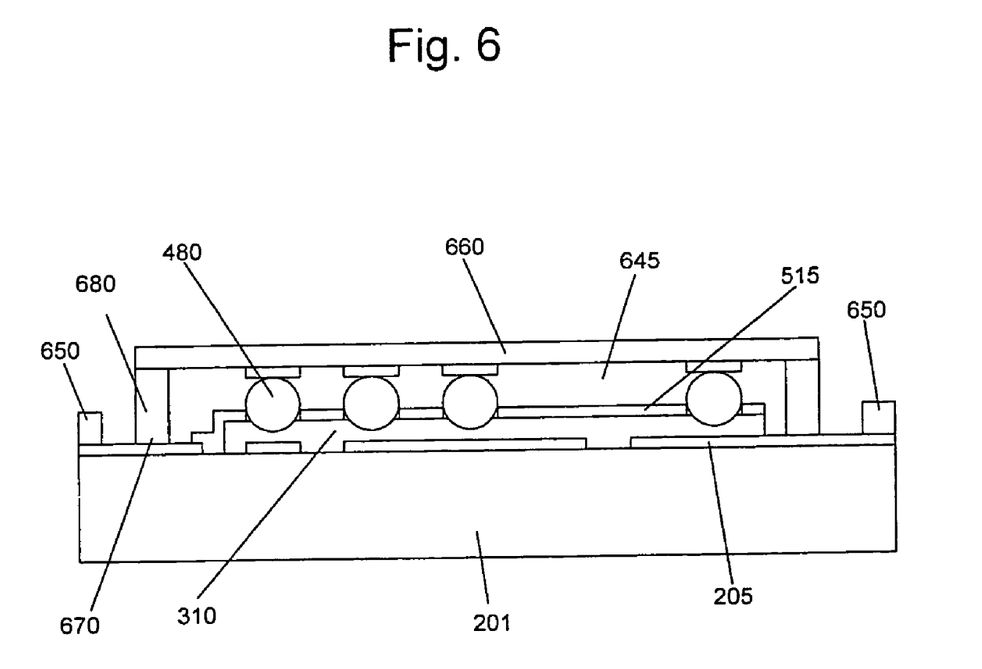

Referring to FIG. 6, a cap 660 is mounted on the substrate to encapsulate the device. The cap creates a cavity 645, providing separation between it and the OLED cells. In one embodiment, a sealing frame 670 surrounding the cell region is prepared. Preparation of the sealing frame includes patterning the substrate, if necessary, to form an area for forming a sealing post 680 therein. Alternatively, the sealing frame can be formed on the cap. The height of the sealing post is sufficient to form a cavity 645 with the desired height. The use of a sealing frame is described in international patent application "Improved Encapsulation of Organic LED Device", PCT/SG00/00133, which is herein incorporated by reference for all purposes.

The cap layer 660 comprises, for example, metal or glass. Other types of caps which protect the active components from the environment, such as ceramic or metallized foil, are also useful. In yet another embodiment of the invention, the cap can be stamped or etched, depending on the material used, to form a cavity separating the cap and the OLED devices. Various techniques can be used to mount the cap layer. In one embodiment, an adhesive is used to mount the cap layer. Adhesives such as self-hardening adhesives, UV or thermal curable adhesives, or hot melt adhesives are useful. Other techniques which employ low temperature solder materials, ultrasonic bonding, or welding techniques using inductance or laser welding are also useful.

In one embodiment of the invention, a sealing dam surrounding the device region of the substrate is provided. The sealing dam supports the cap on the substrate and provides a sealing region located at an outer face of the sealing dam. The use of a sealing dam is described in international patent application "Sealing of Electronic Devices", PCT/SG00/00133, which is herein incorporated by reference for all purposes.

During the mounting process, the spacer particles may be pressed into the layers of the OLED cells. The spacer particles provide support for the cap over the area of the OLED cells, preventing the cap from contacting the active components of the device when pressure is applied to the cap. Bond pads 650 are formed to provide electrical access to the OLED cells.

As described, the process deposits the adhesive coated spacer particles after formation of the organic layers. The spacer particles can alternatively be deposited at other points in the process flow. For example, the spacer particles can be deposited before the formation of the first conductive layer, before the formation of the organic layers, or after the formation of the second conductive layer. In effect, the spacer particles can be deposited at any point of the process prior to mounting of the cap.

The adhesive on the spacer particles is cured at some point in the process flow after the deposition of the spacer particles. In one embodiment, the adhesive is cured after the spacer particles are deposited on the substrate and before the formation of the organic layers. In another embodiment, the adhesive is cured after the spacer particles are applied to the first active organic layer and before the formation of the remaining layers. In another embodiment, the adhesive is cured after the spacer particles are applied to the second organic layer and before the formation of the remaining layers. In yet another embodiment, the adhesive is cured after the spacer particles are applied to the second conductive layer and before the encapsulation of the OLED device. Spacer particles can also be useful in providing support in other types of devices that employ cavity packages. Such devices include, for example, electrical devices, mechanical devices, electromechanical devices, or microelectromechanical systems (MEMS).

While the invention has been particularly shown and described with reference to various embodiments, it will be recognized by those skilled in the art that modifications and changes may be made to the present invention without departing from the spirit and scope thereof. The scope of the invention should therefore be determined not with reference to the above description but with reference to the appended claims along with their full scope of equivalents.

What is claimed is:

1. A method for forming a device, comprising:
   providing a substrate with a device region;
   applying a layer of adhesive on spacer particles;
   depositing the spacer particles on the substrate;
   curing the layer of adhesive on the spacer particles; and
   mounting a cap on the substrate to encapsulate the device region, the cap forming a cavity over the device region, the cap supported by the spacer particles.

2. The method of claim 1 wherein providing a substrate with a device region includes providing a substrate having one or more organic light emitting diodes in the device region.

3. The method of claim 2 wherein providing the substrate with one or more organic light emitting diodes includes:
   forming a conductive layer;
   patterning the conductive layer to from first electrodes; and
   forming at least one organic functional layer over the conductive layer.

4. The method of claim 3 wherein the spacer particles comprise a non-conductive material.

5. The method of claim 4 wherein the adhesive comprises thermally curable material.

6. The method of claim 4 wherein the adhesive comprises ultraviolet curable material.

7. The method of claim 4 wherein the adhesive comprises a hot melt material.

8. The method of claim 4 wherein depositing the spacer particles comprises dry spraying.

9. The method of claim 8 wherein depositing the spacer particles on the substrate forms a layer of spacer particles, the method further comprising photolithographically patterning the layer of spacer particles.

10. The method of claim 8 wherein depositing the spacer particles on the substrate forms a layer of spacer particles, the method further comprising patterning the layer of spacer particles with a resist method.

11. The method of claim 8 wherein depositing the spacer particles on the substrate includes depositing the spacer particles through a shadow mask.

12. The method of claim 8 wherein the dry spraying comprises:
electrostatically charging the substrate with a first polarity and the spacer particles with a second polarity; and
blowing the spacer particles against the substrate with dry air.

13. The method of claim 12 wherein the dry air has a dew point of ≦58° C.

14. The method of claim 13 wherein depositing the spacer particles on the substrate forms a layer of spacer particles, the method further comprising photolithographcially patterning the layer of spacer particles.

15. The method of claim 13 wherein depositing the spacer particles on the substrate forms a layer of spacer particles, the method further comprising patterning the layer of spacer particles with a resist method.

16. The method of claim 13 wherein depositing the spacer particles on the substrate includes depositing the spacer particles through a shadow mask.

17. The method of claim 4 wherein depositing the spacer particles comprises wet spraying.

18. The method of claim 17 wherein the wet spraying comprises:
suspending the spacer particles in a solution; and
spraying the solution with the spacer particles onto the substrate.

19. The method of claim 18 wherein the solution comprises a concentration of the spacer particles of about 0.1–0.5 weight percent.

20. The method of claim 19 wherein depositing the spacer particles on the substrate forms a layer of spacer particles, the method further comprising photolithographically patterning the layer of spacer particles.

21. The method of claim 19 wherein depositing the spacer particles on the substrate forms a layer of spacer particles, the method further comprising patterning the layer of spacer particles with a dry resist method.

22. The method of claim 19 wherein depositing the spacer particles on the substrate includes depositing the spacer particles through a shadow mask.

* * * * *

UNITED STATES PATENT AND TRADEMARK OFFICE
CERTIFICATE OF CORRECTION

PATENT NO. : 7,166,007 B2 Page 1 of 1
APPLICATION NO. : 10/981980
DATED : January 23, 2007
INVENTOR(S) : Mark Auch et al.

It is certified that error appears in the above-identified patent and that said Letters Patent is hereby corrected as shown below:

Column 4, Line 52; replace:
"for example, a dew point ≤ -58° C. at pressure of 2" with
-- for example, a dew point ≤ 58° C. at pressure of 2 --

Column 6, Line 48, at Claim 3; replace:
"patterning the conductive layer to from first electrodes;" with
-- patterning the conductive layer to form first electrodes; --

Column 7, Line 16, at Claim 14; replace:
"the method further comprising photolithographcially pat-" with
-- the method further comprising photolithographically pat- --

Signed and Sealed this

Sixteenth Day of October, 2007

JON W. DUDAS
*Director of the United States Patent and Trademark Office*